United States Patent [19]

Saigo et al.

[11] Patent Number: 4,564,576

[45] Date of Patent: Jan. 14, 1986

[54] RESIST MATERIAL COMPRISING POLYMER OF ALLYLSILYL COMPOUND AND PATTERN FORMING METHOD USING THE RESIST MATERIAL

[75] Inventors: Kazuhide Saigo; Masayoshi Suzuki, both of Tokyo, Japan

[73] Assignee: NRC Corporation, Tokyo, Japan

[21] Appl. No.: 612,925

[22] Filed: May 22, 1984

[30] Foreign Application Priority Data

May 27, 1983 [JP] Japan .................................. 58-93577
Oct. 26, 1983 [JP] Japan ................................ 58-200408

[51] Int. Cl.$^4$ ........................ G03C 1/68; G03C 1/70; G03C 5/16; C08F 30/08
[52] U.S. Cl. .................................... 430/197; 430/288; 430/296; 430/270; 522/64; 526/279
[58] Field of Search ............... 430/197, 288, 287, 296, 430/270; 526/279; 204/159.13

[56] References Cited

U.S. PATENT DOCUMENTS 2,538,657 1/1951 Rochow .............................. 526/279
3,945,830 3/1976 Yazawa et al. ................. 430/197 X
4,301,231 11/1981 Atarashi et al. ..................... 430/287

FOREIGN PATENT DOCUMENTS 0096596 12/1983 European Pat. Off. ............ 430/280
1001838 8/1965 United Kingdom ................ 526/279

*Primary Examiner*—John E. Kittle
*Assistant Examiner*—Cynthia Hamilton
*Attorney, Agent, or Firm*—Burns, Doane, Swecker & Mathis

[57] ABSTRACT

A polymer having allyl groups each attached to a silicon atom serves as a resist material which is highly resistive to dry etching such as reactive sputter etching with oxygen and sensitive to electron beams, X-rays and deep UV rays. By the addition of a bis-azide compound known as a photosensitive cross-linking agent the resist material becomes sensitive also to UV and near UV rays. A very suitable polymer is obtained by polymerizing either a triallylsilane or an allylsilylstyrene or by copolymerizing an allylsilylstyrene with another ethylenic compound copolymerizable with styrene. This resist material is used in a pattern forming method of the two-layer type, in which a fine pattern is generated in a thin film of the resist material by lithography and then transferred into an underlying thick organic layer by dry etching of the thick organic layer with the resist pattern as a mask.

11 Claims, No Drawings

RESIST MATERIAL COMPRISING POLYMER OF ALLYLSILYL COMPOUND AND PATTERN FORMING METHOD USING THE RESIST MATERIAL

BACKGROUND OF THE INVENTION

This invention relates to a novel resist material which is sensitive to electron-beams, X-rays, deep ultraviolet rays and near ultraviolet rays and highly resistive to dry etching, and to a pattern forming method in which the novel resist material is used to form a resist pattern that serves as a mask for dry etching of an underlying organic layer.

In the manufacture of microelectronic devices such as semiconductor integrated circuit devices including LSI devices and bubble memory devices, optical lithography and electron-beam lithography are widely used to form fine patterns. The thickness of a resist layer is an important factor in realization of high resolution patterns. It is well known that the use of a thick resist layer results in low resolution mainly by reason of reflection from the substrate in the case of optical lithography and scattering of electrons in the case of electron-beam lithography.

Recently, dry etching techniques such as gas plasma etching, reactive sputter etching and ion milling are often used for the purpose of transferring a resist pattern produced by exposure and development into the substrate with high accuracy. In such cases, it is difficult to use a desirably thin resist layer to thereby obtain a high resolution pattern because the resist pattern too undergoes etching during the dry etching process and fails to exhibit resistivity sufficient for processing of the substrate. Furthermore, it is not seldom that the surface of the substrate to be etched has steps, and in such cases it is necessary to form a considerably thick resist layer so as to accomplish complete coverage of the steps to thereby provide a flat surface. Then, it becomes very difficult to form fine patterns in such a thick resist layer.

To solve the above described problems, J. M. Moran et al have proposed a three-layer technique in Journal of Vacuum Science and Technology, Vol. 16, No. 6, 1620 (1979). According to this three-layer technique the first layer which covers the substrate surface and provides a flat surface is a sufficiently thick layer of an organic material such as a conventional resist material, and the intermediate layer is formed of an inorganic material that cannot easily be etched by dry etching with oxygen, such as silicon, silicon dioxide or silicon nitride. The third or top layer is a thin resist layer. In the patterning process, first the resist layer is exposed to light, X-ray or electron-beams and developed to produce a resist pattern. Next, the intermediate layer is subjected to dry etching with the resist pattern as a mask. Finally, the thick organic layer is etched by reactive sputter etching using $O_2$ with the patterned intermediate layer as a mask. By this method a high resolution pattern initially generated in the thin resist layer can be transferred to the thick organic layer which is in direct contact with the substrate surface. However, it is a disadvantage of the three-layer technique that the processing operations become complicated and time-consuming mainly because of the addition of the intermediate layer which is formed by vacuum deposition, sputtering or plasma CVD method.

If it is practicable to use a resist material which is sufficiently resistive to dry etching, it becomes possible to etch a thick organic layer by directly using the initially patterned resist layer as a mask, so that the above described three-layer structure can be simplified to a two-layer structure. To our knowledge, however, such a convenient resist material is not available in the present state of the art. Polydimethylsiloxane is known as resistive to dry etching to such extent that the etch rate of this material by $O_2$ plasma etching is nearly zero. However, polydimethylsiloxane is unsuitable for practical use as a resist material because this polymer is liquid at room temperature so that a coating film of this polymer is liable to suffer from adhesion of dust particles and fail to provide a high resolution pattern due to its fluidity.

In our co-pending application Serial No. 501,201 filed June 6, 1983, we have proposed a pattern forming method of the two-layer type using a resist meterial which comprises a polymer or copolymer having trialkylsilyl, trialkoxysilyl or dimethylphenylsilyl groups. This resist material is highly resistive to reactive sputter etching with $O_2$ and sensitive to electron beams and deep ultraviolet rays, but this resist material does not undergo cross-linking by exposure to visible light or near ultraviolet rays and, hence, cannot be used as a photoresist.

SUMMARY OF THE INVENTION

It is an object of the present invention to provide a novel resist material which is highly resistive to dry etching and sensitive to electron beams, X-rays, deep ultraviolet rays and near ultraviolet rays and serves the purpose of forming very fine patterns with high resolution.

It is another object of the invention to provide a method of forming fine patterns in the manufacture of microelectronic devices by using a dry etching technique and a resist material according to the invention, which method makes it possible to relatively easily obtain high resolution patterns and requires less steps than a pattern forming method using the above described three-layer technique.

Fundamentally, the present invention is a novel resist material which comprises a polymer produced by polymerizing a monomer having an allylsilyl group. We have discovered that a group of polymers having allylsilyl groups are remarkably resistive to dry etching such as reactive sputter etching with $O_2$ and highly sensitive to electron beams, X-rays and deep UV rays and accordingly can be used as an excellent masking material for etching a thick layer of, e.g., a conventional novolak resin base resist material, and that such polymers become highly sensitive to UV and near UV rays too when a bis-azide compound is added thereto as a photosensitive cross-linking agent. For example, when a resist material according to the invention is applied to a novolak resin layer which is as thick as about 1.6 micrometers for the masking purpose in dry etching of the novolak resin layer, it suffices that the resist material film thickness is only 200–2000 Å. That is, by utilizing the present invention a resist film for patterning can be rendered very thin. When this resist material is used in a pattern forming method of the two-layer type wherein a thick organic layer is present beneath the resist film, a high resolution pattern can easily be obtained because of reduction in the proximity effect in the case of electron-beam lithography and because of reduction in the unfavorable effect of reflection from the substrate in the case of optical lithography. High resolution patterns can easily be obtained also when different exposure methods are employed.

More particularly, a polymer produced by polymerizing a triallylsilane expressed by the general formula R-Si(CH$_2$—CH=CH$_2$)$_3$, where R represents a hydrogen atom, a lower alkyl group such as methyl, ethyl or propyl, or phenyl group, serves as an excellent resist material. The polymerization, which may be either bulk polymerization or solution polymerization, is carried out at a temperature in the range from 60° to 150° C. for a period of 4–50 hr using a radical polymerization initiator amounting to 1–10 mole % of the triallylsilane. The polymer produced under such conditions comprises at least one, and in most cases both, of the two kinds of structural units of the following formulas (I) and (II).

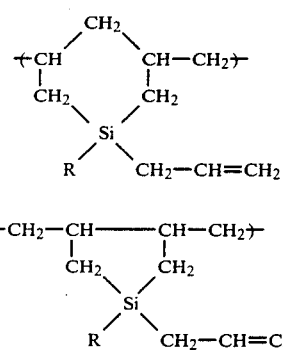

In addition to these structural units, the polymer will possibly include another kind of structural unit of the formula (III).

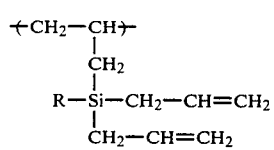

Since this polymer is produced by using a radical polymerization initiator, there is no selectivity in the polymerization reaction and therefore the structural units (I) and (II), and also (III) when included, are arranged in random order. In the present invention it is important that the polymer has allyl groups each attached to a Si atom and that the main chain of the polymer has cyclic portions which have the effect of rendering the softening temperature of the polymer relatively high. These requirements can be met whichever one of the two kinds of structural units (I) and (II) is predominant. The proportions of the structural units (I) and (II) will vary depending on the polymerization reaction conditions, but there is no need of particularly controlling or limiting the proportions.

Another polymer suitable for a resist material of the invention is produced by polymerizing an allylsilylstyrene expressed by the general formula

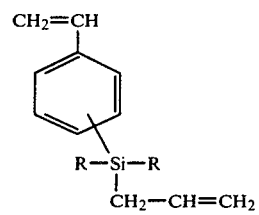

where R represents a hydrogen atom, a lower alkyl group such as methyl, ethyl or propyl, or an allyl group.

The polymerization, which may be either bulk polymerization or solution polymerization, is carried out at a temperature in the range from 40° to 150° C. for a period of 2–30 hr using a radical polymerization initiator amounting to 0.01 to 5 mole % of the allylsilylstyrene. This polymer consists of the structural unit of the formula (IV).

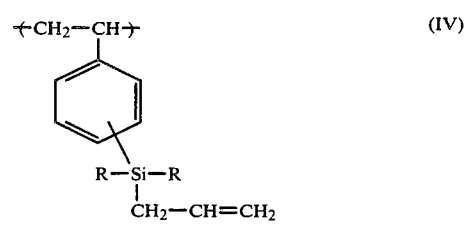

A similarly suitable polymer is obtained by copolymerizing an allylsilylstyrene of the above general formula with another ethylenic monomer CH$_2$=CH—A copolymerizable with styrene. The copolymerization is carried out under the same reaction conditions as in the case of polymerizing the allylsilylstyrene alone. The structure of the copolymer is represented by the formula (V).

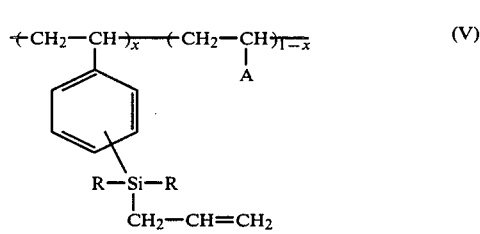

In the formula (V), x is smaller than 1.0. With consideration of the sensitivity of the copolymer to electron beams, X-rays and deep UV rays, and also the sensitivity of a resist material obtained by adding a bis-azide compound to this copolymer to UV and near UV rays, it is necessary that x is not smaller than 0.2.

Preferred examples of the ethylenic unsaturated compound CH$_2$=CH—A are acrylic acid, methacrylic acid, derivatives of these acids such as methyl-, ethyl-, glycidyl-, vinyl and allyl esters of acrylic acid and methacrylic acid, styrene and derivatives of styrene such as chlorostyrene, methylstyrene and chloromethylstyrene.

The polymers according to the invention are soluble in a variety of familiar organic solvents such as benzene, toluene, xylene, acetone and chloroform and relatively high in the glass transition point. Accordingly these polymers can easily be formed into a coating film.

Where a polymer according to the invention is used as a negative resist, the sensitivity becomes higher as the molecular weight becomes higher but the resolution becomes degraded due to the tendency to swell during the development treatment. Usually high resolution can hardly be expected if the weight average molecular weight becomes greater than 1000000 ($10^6$). On the other hand, if the molecular weight is too low the polymer becomes impracticable mainly because of insufficient sensitivity and also because of difficulty in forming a uniform and strong coating film. Therefore, it is preferable that the weight average molecular weight of the polymer is not smaller than 10000 ($10^4$).

As is known, the resolving capability of a polymer used as a resist material is affected also by the degree of uniformity of the molecular weight distribution: the resolving capability becomes better as the degree of polydispersity becomes smaller. In the polymers according to the invention, it is preferable that the degree of polydispersity, i.e. the ratio of the weight average molecular weight to the number average molecular weight, is not larger than 3 in order to ensure good resolving capability.

Using the above described novel resist material, this invention provides a pattern forming method of the two-layer type, which comprises the steps of forming an organic polymer layer which can be etched by dry etching on a substrate to ultimately be etched, forming a resist film on the organic polymer layer by using a resist material according to the invention, forming a desired pattern in the resist film by a lithography technique, and etching the organic polymer layer by a dry etching technique with the patterned resist film as a mask.

By using this pattern forming method, a fine pattern formed in a very thin resist film can accurately be transferred into a relatively thick organic polymer layer. High resolution can be realized for the reasons mentioned hereinbefore. As an additional advantage of this method, the processing steps are simplified compared with the three-layer technique described hereinbefore.

DESCRIPTION OF THE PREFERRED EMBODIMENTS

In producing a polymer according to the invention, use is made of a conventional radical polymerization initiator which may be a peroxide such as benzoyl peroxide or an azo compound such as $\alpha,\alpha'$-azobisisobutyronitrile.

If the polymerization reaction proceeds to an excessive extent, gelation of the polymer will take place. Therefore, the reaction is terminated before gelation of the polymer by pouring the reaction liquid into methanol to thereby precipitate the polymer. After recovery of the precipitated polymer, fractional precipitation and refining of the polymer can easily be accomplished by first dissolving the polymer in, e.g., methylethylketone, then dropping methanol into the solution until the solution becomes whitish cloudy and thereafter adding an adequate quantity of methanol to the cloudy liquid.

In addition to the structural units described hereinbefore, a polymer according to the invention may comprise different cyclic structure(s) such as the structure of cyclopentene, cyclohexene and/or cycloheptene.

As to the bis-azide compound known as photosensitive cross-linking agent and used in the present invention, 4,4'-diazidechalcone, 2,6-di-(4'-azidebenzylidene)-cyclohexanone, 2,6-di-(4'-azidebenzylidene)-4-methylcyclohexanone and 2,6-di-(4'-azidebenzylidene)-4-hydroxycyclohexanone can be named as typical examples. If the amount of the bis-azide compound is too small or too large it is impossible to improve the sensitivity to UV rays. Besides, the addition of an excessively large amount of bis-azide compound results in lowering of the resistivity to dry etching with $O_2$. Therefore, the amount of the bis-azide compound is specified to be 0.1–50% by weight of the polymer, and preferably limited within the range of 0.5–20 wt % of the polymer.

In the pattern forming method according to the invention, first the substrate surface to be processed is coated with a sufficiently thick organic layer by using a conventional material such as a novolak resin base resist material. After solidification of the organic layer a resist film is formed thereon by applying a solution of a resist material according to the invention, usually by spinning, and drying the applied solution by adequate heating. Then a desired pattern is delineated on the resist film by using either radiation of electron beams or X-rays or exposure to light such as deep UV rays or UV rays, and development is performed by using a suitable developer liquid. For the purpose of processing the thus treated element it is possible, for example, to etch the firstly formed thick organic layer by reactive sputter etching with $O_2$ using the resist pattern as a mask. After that, the thick organic layer formed with a fine pattern can be used as a mask for etching the substrate. It is also possible to use the thick organic layer formed with the pattern as a mask in an ion implantation process. Still alternatively, this method is applicable also to a lift-off process because of the possibility of obtaining a sufficiently thick organic layer formed with a fine pattern.

The invention will further be illustrated by the following nonlimitative examples.

EXAMPLE 1

Polymerization of triallylsilane H—Si(CH$_2$—CH=CH$_2$)$_3$ was carried out by the following process.

A reaction tube was charged with a solution of 7.6 g (0.05 mole) of triallylsilane in 7.6 ml of benzene and connected to a rubber tube fitted with a pinchcock. Using liquid nitrogen the solution was frozen for the purpose of degassing and then liquefied. This procedure was repeated five times to thereby complete the degassing.

The degassed solution of triallylsilane was put into a 100 ml three-neck flask equipped with a nitrogen gas feed pipe and a reflux condenser and heated to a reflux temperature (about 90° C.). To initiate a polymerization reaction 0.12 g (1.0 mole % of triallylsilane) of benzoyl peroxide (BPO) was added to the solution under reflux, and the addition of the same quantity of BPO was repeated five times more at intervals of 1 hr, so that the total quantity of BPO reached 0.72 g. By the time of the addition of the last portion of BPO the viscosity of the reaction liquid increased considerably. After that the reaction was continued for an additional 30 min, and then the solution of polymerized triallylsilane was poured into methanol. Since the polymer sank to provide a bottom layer, the supernatant liquid was decanted. Then the polymer was dissolved in 100 ml of benzene, and the solution was poured into a large volume of methanol to precipitate a polymer powder. This dissolution-precipitation procedure was repeated three times to obtain a refined polymer powder, which was separated from the solvent by filtration and dried under reduced pressure. The dried polymer weighed 3.2 g, so that the yield was 42%. This polymer had a weight average molecular weight ($M_w$) of 280000 and a number average molecular weight ($M_n$) of 43000. Therefore, the degree of polydispersity $M_w/M_n$ was 6.5.

Analysis of this polymer gave the following values.

Infrared Absorption Sepctrum ($cm^{-1}$): 2150 (Si—H), 1630 (allyl group), 920 (SiH).

Magnetic Resonance Spectrum ($\delta$) ppm: 0.5–2.3 (10H, br, alkane), 3.7–4.3 (1H, br, H–Si), 4.3–6.2 (3H, br, $CH_2=CH—$).

Elementary Analysis: theory: C 71.10%, H 10.53%, Si 18.42%. analysis: C71.40%, H 10.20%, Si 18.07%.

A resist material solution was prepared by dissolving 2.0 g of the triallylsilane polymer hereinafter referred to as HASi) synthesized by the above described process in 20 ml of xylene (to obtain 10 wt % solution) with sufficient stirring, followed by filtration with a 0.2 micrometers filter.

This solution was applied by spinning to a silicon substrate and dried in nitrogen gas stream at 80° C. for 30 min to thereby form a HASi film having a thickness of 0.210 micrometers. The HASi film was subjected to electron-beam exposure with a conventional electron-beam exposure system for delineation of fine patterns and then left standing in vacuum for 30 min. After that development was carried out by 1 min soaking in xylene, followed by 1 min rinsing with isopropanol. After drying the thickness of the film in the exposed areas was measured with a Tayor-Hobson "Tally Step" instrument. The resolving capability of the HASi film as a resist layer was examined by delineating patterns of various line and space widths on the film by electron-beam exposure and, after development, observing the respective patterns formed in the resist layer with optical microscope and scanning electron microscope.

It was found that the dose of irradiation sufficient to cause gelation of the HASi film hereinafter represented by $D_g^i$) was 0.12 microcoulombs/cm$^2$ and the dose that caused the film thickness to reduce to 50% of the initial thickness (hereinafter represented by $D_g^{50}$) was 0.25 microcoulombs/cm$^2$. It was confirmed that submicron lines and spaces in the patterns formed with irradiation dose of 0.4 microcoulombs/cm$^2$ were well resolved, so that the HASi film was judged to be excellent in resolution.

As a next experiment, the HASi film was subjected to reactive sputter etching with $O_2$ gas to examine the manner of decrease in the film thickness. The etching was carried out at a pressure of 2.0 Pa, rf power density of 0.16 W/cm$^2$ and $O_2$ gas flow rate of 5 sccm. During an initial phase of the etching operation the film thickness decreased by 250 Å, but thereafter the etch rate became as low as only a few angstroms per minute, meaning that the etching terminated in a practical sense. When a film of a conventional novolak resin photoresist (tradename AZ-1350J of Shipley Co.) was etched under the same etching conditions, the film thickness continued to decrease at a nearly constant rate of about 2500 Å/min. Thus, it was ascertained that a HASi film having a thickness of 250 Å or more can be used as a mask for etching an AZ-1350J layer which is as thick as 1 micrometer or more. This was evidenced by the following experiment.

AZ-1350J was applied to a silicon substrate to form a 1.6 micrometers thick film, and prebaking was carried out at 250° C. for 1 hr. Then, the aforementioned solution of HASi in xylene was spun on the surface of the AZ-1350J film and dried in a nitrogen gas stream at 80° C. for 30 min. The thickness of the thus formed HASi film was estimated to be 0.21 micrometers from the previously ascertained relationship between the rpm of the spinner and the film thickness. A submicron pattern was formed in the HASi film by the above described electron-beam exposure and development process. With the patterned HASi film as a mask the AZ-1350J film was etched for 7 min by means of a reactive sputter etching apparatus of the parallel plate type, which was operated at a pressure of 2.0 Pa, power density of 0.16 W./cm$^2$ and $O_2$ gas flow rate of 5 sccm. As a result, a submicron pattern initially delineated in the HASi film with irradiation dose of 0.5 microcoulombs/cm$^2$ was transferred into the underlying 1.6 micrometers thick layer of AZ-1350J.

EXAMPLE 2

Polymerization of triallylmethylsilane $CH_3—Si(CH_2—CH=CH_2)_3$ was carried out by the following process.

A solution of 8.3 g (0.05 mole) of triallylmethylsilane in 8.3 ml of benzene was subjected to the degassing procedure described in Example 1. In the reactor (three-neck flask) mentioned in Example 1, the degassed solution of triallylmethylsilane was heated to a reflux temperature. To initiate a polymerization reaction 0.12 g (1 mole % of triallylmethylsilane) of BPO was added to the solution under reflux, and the addition of the same quantity of BPO was repeated nine times more at intervals of 1 hr, so that the total quantity of BPO reached 1.2 g. By the time of the addition of the last portion of BPO the viscosity of the reaction liquid increased considerably. After that the heating was continued for additional 1 hr, and then the solution of polymerized triallylmethylsilane was poured into methanol. Since the polymer sank to provide a bottom layer, the supernatant liquid was decanted. Then the polymer was dissolved in 100 ml of benzene, and the solution was poured into a large volume of methanol to precipitate a polymer powder. This dissolution-precipitation procedure was repeated three times to obtain a refined polymer powder, which was separated from the solvent by filtration and dried under reduced pressure. The dried powder weighed 3.3 g, so that the yield was 40%. $M_w$ of this polymer was 130000 and $M_n$ was 19000. Therefore, $M_w/M_n$ was 6.8.

Analysis of this polymer gave the following values.

Infrared Absorption Spectrum ($cm^{-1}$): 1630 (allyl group), 1260, 820 (Si—C).

Magnetic Resonance Spectrum ($\delta$) ppm: 0.0–2.3 (13H, br, alkane and $CH_3Si$), 4.0–6.3 (3H, br, $CH_2=CH—$).

Elementary Analysis: theory: C 72.29%, H 10.84%, Si 16.87%. analysis: C 72.02%, H 10.55%, Si 16.32%.

A resist material solution was prepared by dissolving 1.0 g of the triallylmethylsilane polymer (hereinafter referred to as MeASi) synthesized by the above described process in 10 ml of xylene (to obtain 10 wt % solution) with sufficient stirring, followed by filtration with a 0.2 micrometers filter.

This solution was spun on a silicon substrate and dried in a nitrogen gas stream at 80° C. for 30 min to thereby form a MeASi film having a thickness of 0.18 micrometers. The MeASi film was subjected to electron-beam exposure with a conventional electron-beam exposure system for delineation of fine patterns and then left standing in vacuum for 30 min. After that develoment was carried out by 1 min soaking in xylene, followed by 1 min rinsing with isopropanol. After drying the sensitivity and resolution of the MeASi film were measured by the same methods as in Example 1. In this case $D_g{}^i$ was 0.26 microcoulombs/cm$^2$ and $RD_g{}^{50}$ was 0.54 microcoulombs/cm$^2$. Submicron lines and spaces in the patterns formed with irradiation dose of 0.7 microcoulombs/cm$^2$ were well resolved, so that the MeASi film was judged to be excellent in resolution.

Next, the MeASi film was subjected to reactive sputter etching with O$_2$ gas under the same etching conditions as in Example 1 to examine the manner of decrease in the film thickness. During an initial phase of the etching operation the film thickness decreased by 380 Å but thereafter the etch rate became as low as only a few angstroms per minute, meaning that the etching terminated in a practical sense. Thus, it was ascertained that a MeASi film having a thickness of 380 Å or more can be used as a mask for etching an AZ-1350J layer which is as thick as 1 micrometer or more. This was evidenced by the followed experiment.

AZ-1350J was applied to a silicon substrate to form a 1.6 micrometers thick film, and prebaking was carried out at 250° C. for 1 hr. Then, the aforementioned solution of MeASi in xylene was spun on the surface of the AZ-1350J film and dried in a nitrogen gas stream at 80° C. for 30 min. The thickness of the thus formed MeASi film was estimated to be 0.18 micrometers. A submicron pattern was formed in the MeASi film by the above described electron-beam exposure and development process. With the patterned MeASi film as a mask the AZ-1350J film was etched for 7 min by reactive sputter etching with O$_2$ gas with the same apparatus and under the same etching conditions as in Example 1. As a result, a submicron pattern initially delineated in the MeASi film with irradiation dose of 0.8 microcoulombs/cm$^2$ was transferred into the underlying 1.6 micrometers thick layer of AZ-1350J.

EXAMPLE 3

Polymerization of triallylphenylsilane Ph—Si(CH$_2$—CH=CH$_2$)$_3$ was carried out by the following process.

A solution of 10 g (0.044 mole) of triallylphenylsilane in 10 ml of benzene was subjected to the degassing procedure described in Example 1. In the reactor (three-neck flask) mentioned in Example 1, the degassed solution was heated to a reflux temperature. To initiate a polymerization reaction 0.1 g (1 mole % of triallylphenylsilane) of BPO was added to the solution under reflux, and the addition of the same quantity of BPO was repeated ten times more at intervals of 1 hr, so that the total quantity of BPO reached 1.1 g. The viscosity of the reaction liquid began to considerably increase nearly at the time of the addition of the last portion of BPO. After that the reflux was continued for additional 1 hr, and then the solution of polymerized triallylphenylsilane was poured into a large volume of methanol. Since the polymer sank to provide a bottom layer, the supernatant liquid was decanted. Then the polymer was dissolved in 100 ml of benzene, and the solution was poured into a large volume of methanol to precipitate a polymer powder. This dissolution-precipitation procedure was repeated three times to obtain a refined polymer powder, which was separated from the solvent by filtration and dried under reduced pressure. The dried powder weighed 4.2 g, so that the yield was 42%. $M_w$ of this polymer was 400000 and $M_n$ was 38000. Therefore, $M_w/M_n$ was 10.5.

Analysis of this polymer gave the following values.

Infrared Absorption Spectrum (cm$^{-1}$): 1280, 890 (Si—C), 990, 700 (vinyl group), 1620, 780 (phenyl group).

Magnetic Resonance Spectrum (δ) ppm: 0.2–2.3 (12H, br, alkane), 4.5–6.3 (3H, br, CH$_2$=CH—), 7.0–7.8 (5H, br, phenyl)

Elementary Analysis: theory: C 78.95%, H 8.77%, Si 12.78%. analysis: C 79.10%, H 8.55%, Si 12.41%.

Preparatory to fractional precipitation, 3.5g of the triallylphenylsilane polymer (hereinafter referred to as PhASi) synthesized by the above described process was dissolved in 350 ml of methylethylketone, and methanol was dropped into the solution. The solution became whitish cloudy when the quantity of dropped methanol reached 50 ml. After the addition of additional 20 ml of methanol, the cloudy liquid was gently heated to become clear. Then the solution was left standing for 24 hr to result in sedimentation of the polymer. The upper liquid layer was separated from the polymer by decantation. The polymer was dissolved in 50 ml of benzene, and the solution was poured into a large volume of methanol to precipitate the first fraction of PhASi, which weighed 0.8 g in dry state. $M_w$ of the first fraction of PhASi was 700000 and $M_n$ was 540000, so that $M_w/M_n$ was 1.3. Next, 20 ml of methanol was added to the liquid separated by decantation to cause precipitation of the second fraction of PhASi, which was separated and recrystallized similarly to the first fraction. The dry weight of the second fraction of PhASi was 0.7 g. $M_w$ of this fraction was 340000 and $M_n$ was 264000, so that $M_w/M_n$ was 1.3. In the same way, the third fraction of PhASi (dry weight 0.9 g) was obtained from the remaining liquid to which 20 ml of methanol was added. $M_w$ of the third fraction was 136000 and $M_n$ was 103000, so that $M_w/M_n$ was 1.3.

A resist material solution was prepared by dissolving 0.56 g of the second fraction of PhASi in 5.6 ml of xylene (to obtain 10 wt % solution) with sufficient stirring, followed by filtration with a 0.2 micrometers filter.

This solution was spun on a silicon substrate and dried in a nitrogen gas stream at 80° C. for 30 min to thereby form a PhASi film having a thickness of 0.23 micrometers. The PhASi film was subjected to electron-beam exposure with a conventional electron-beam exposure system for delineation of fine patterns and then left standing in vacuum for 30 min. After that development was carried out by 1 min soaking in xylene, followed by 1 min rinsing with isopropanol. After drying the sensitivity and resolution of the PhASi film were measured by the same methods as in Example 1. In this case $D_g{}^i$ was 0.1 microcoulombs/cm$^2$ and $D_g{}^{50}$ was 0.22 microcoulombs/cm$^2$. Submicron lines and spaces in the patterns formed with irradiation dose of 0.4 microcoulombs/cm$^2$ were well resolved, so that the PhASi film was judged to be excellent in resolution.

Next, the PhASi film was subjected to reactive sputter etching with O$_2$ gas under the same etching conditions as in Example 1 to examine the manner of decrease in the film thickness. During an initial phase of the etching operation the film thickness decreased by 700 Å, but thereafter the etch rate became as low as only a few angstroms per minute, meaning that the etching terminated in a practical sense. Thus, it was ascertained that a PhASi film having a thickness of 700 Å or more can be used as a mask for etching an AZ-1350J layer which is as thick as 1 micrometer or more. This was evidenced by the following experiment.

AZ-1350J was applied to a silicon substrate to form a 1.6 micrometers thick film, and prebaking was carried out at 250° C. for 1 hr. Then, the aforementioned solution of the second fraction of PhASi in xylene was spun on the surface of the AZ-1350J film and dried in a nitrogen gas stream at 80° C. for 30 min. The thickness of the thus formed PhASi film was estimated to be 0.23 micrometers. A submicron pattern was formed in the PhASi film by the above described electron-beam exposure and development process. With the patterned PhASi film as a mask the AZ-1350J film was etched by reactive sputter etching with $O_2$ gas with the same apparatus and under the same etching conditions as in Example 1. As a result, a submicron pattern initially delineated in the PhASi film with irradiation dose of 0.5 microcoulombs/$cm^2$ was transferred into the underlying 1.6 micrometers thick layer of AZ-1350J.

EXAMPLE 4

A resist material solution was prepared by dissolving 1.0 g of HASi synthesized in Example 1 and 0.01 g of 2,6-di-(4'-azidebenzylidene)-cyclohexanone in 20 ml of xylene with sufficient stirring, followed by filtration with a 0.2 micrometers filter.

This solution was spun on a silicon substrate and dried in a nitrogen gas stream at 80° C. for 30 min to thereby form a HASi film having a thickness of 0.19 micrometers. With a chromium mask, the HASi film was exposed to ultraviolet rays using a conventional UV light exposure apparatus. After that development was carried out by 1 min soaking in xylene, followed by 1 min rinsing with isopropanol. After drying the sensitivity and resolution of the HASi film were measured by the same methods as in Example 1. When the exposure time was 2.5 sec, the thickness of the HASi film remained almost unchanged from the initial film thickness. For comparison, exposure of a 0.5 micrometers thick film of AZ-1350J with the same UV light exposure apparatus required an exposure time of 7 sec. In the patterns formed in the HASi film by 2.5 sec exposure to UV light 1 micrometer lines and spaces were well resolved, so that the HASi film was judged to be excellent in resolution.

In the next experiment, AZ-1350J was applied to a silicon substrate to form a 1.6 micrometers thick film, and prebaking was carried out at 250° C. for 1 hr. Then, the aforementioned solution of HASi and bis-azide compound was spun on the surface of the AZ-1350J film and dried in a nitrogen gas stream at 80° C. for 30 min. The thickness of the thus formed HASi film was estimated to be 0.19 micrometers. A fine pattern of 1 micrometer lines and spaces was formed in the HASi film by 2 sec exposure to UV light with a chromium mask and the development treatment described above. The thus treated wafer was subjected to reactive sputter etching with $O_2$ gas for 7 min with the same apparatus and under the same etching conditions as in Example 1. As a result, the one-micron pattern initially delineated in the HASi film was transferred into the underlying 1.6 micrometers thick layer of AZ-1350J.

EXAMPLE 5

A resist material solution was prepared by dissolving 1.0 g of MeASi synthesized in Example 2 and 0.01 g of 2,6-di-(4'-azidebenzylidene)cyclohexanone in 20 ml of xylene with sufficient stirring, followed by filtration with a 0.2 micrometers filter.

Using this solution, a MeASi film having a thickness of 0.17 micrometers was formed on a silicon substrate by the same method as in Example 4. The sensitivity and resolution of this film in the case of exposure to UV light were examined in the same manner as in Example 4. When the exposure time was 5.5 sec, the thickness of the MeASi film remained almost unchanged from the initial film thickness. In the patterns formed in this film by 5.5 sec exposure to UV light 1 micrometer lines and spaces were well resolved, so that the MeASi film containing the bis-azide compound was judged to be excellent in resolution.

In the next experiment a 1.6 micrometers thick film of AZ-1350J was formed on a silicon substrate and prebaked at 250° C. for 1 hr, and the aforementioned solution of MeASi and bis-azide compound was spun on the surface of the AZ-1350J film and dried in a nitrogen gas stream at 80° C. for 30 min. The thickness of the thus formed MeASi film was estimated to be 0.17 micrometers. A fine pattern of 1 micrometer lines and spaces was formed in the MeASi film by 5.5 sec exposure to UV light with a chromium mask and the development treatment described in Example 4. The thus treated wafer was subjected to reactive sputter etching with $O_2$ gas for 7 min in the same manner as in Example 4. As a result, the one-micron pattern initially delineated in the MeASi film was transferred into the underlying 1.6 micrometers layer of AZ-1350J.

EXAMPLE 6

A resist material solution was prepared by dissolving 0.4 g of the second fraction of PhASi synthesized in Example 3 and 0.004 g of 2,6-di-(4'-azidebenzylidene)-cyclohexanone in 4 ml of xylene, followed by filtration with a 0.2 micrometers filter.

Using this solution, a PhASi film having a thickness of 0.18 micrometers was formed on a silicon substrate by the same method as in Example 4. The sensitivity and resolution of this film in the case of exposure to UV light were examined in the same manner as in Example 4. When the exposure time was 2 sec, the thickness of the PhASi film remained almost unchanged from the initial film thickness. In the patterns formed in this film by 2 sec exposure to UV light 1 micrometer lines and spaces were well resolved, so that the MeASi film containing the bis-azide compound was judged to be excellent in resolution.

In the next experiment a 1.6 micrometers thick film of AZ-1350J was formed in a silicon substrate and prebaked at 250° C. for 1 hr, and the aforementioned solution of PhASi and bis-azide compound was spun on the surface of the AZ-1350J film and dried in a nitrogen gas stream at 80° C. for 30 min. The thickness of the thus formed PhASi film was estimated to be 0.18 micrometers. A fine pattern of 1 micrometer lines and spaces was formed in the PhASi film by 2 sec exposure to UV light with a chromium mask and the development treatment described in Example 4. With the patterned PhASi film as a mask, etching of the AZ-1350J film by reactive sputter etching with $O_2$ gas was carried out in the same manner as in Example 4. As a result, the one-micron pattern initially delineated in the PhASi film was transferred into the underlying 1.6 micrometers thick layer of AZ-1350J.

EXAMPLE 7

A polymer having the unit structure shown below was prepared by the following process.

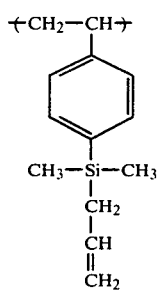

In a 100 ml three-neck flask, a mixture of 1.83 g of p-allyldimethylsilylstyrene, 0.076 g (3 mole %) of BPO and 5 ml of benzene was heated in a nitrogen atmosphere to undergo polymerization reaction for 7 hr at a reflux temperature (about 90° C.). After that the reaction liquid was poured into methanol to precipitate a polymer. After filtration the polymer was again dissolved in benzene, and the solution was poured into methanol to precipitate the refined polymer, which was recovered by filtration and dried at 50° C. under reduced pressure. The dried polymer weighed 0.42 g, so that the yield was 23%. $M_w$ of this polymer was 63000 and $M_n$ was 31000. Therefore, $M_w/M_n$ was 2.03.

Analysis of this polymer gave the following values.

Infrared Absorption Spectrum (cm$^{-1}$): 1630 (allyl group), 1250, 830 (Si—C).

Magnetic Resonance Spectrum (δ) ppm: 0.2–0.5 (br, 6H, CH$_3$), 0.8–3.3 (br, 5H, —CH$_2$—CH=CH$_2$, —CH$_2$—, CH-φ, 4.2–5.3 (br, 3H, —CH=CH$_2$), 6.0–7.5 (br, 4H benzene ring).

Elementary Analysis: theory: C 77.23%, H 8.91%, Si 13.86%. analysis: C 76.94%, H 8.99%, Si 13.52%.

The allyldimethylsilylstyrene polymer hereinafter referred to as ASiSt) and 2,6-di-(4'-azidebenzal)-4-methylcyclohexane amounting to 8 wt % of ASiSt were dissolved in xylene, followed by filtration with a 0.2 micrometers filter, to thereby prepare a photoresist material solution. In this solution the polymer concentration was about 10 % by weight.

A conventional novolak resin base photoresist (MP-1300 of Shipley Co.) was applied to a silicon wafer to a thickness of 1.2 micrometers, and prebaking was carried out at 250° C. for 1 hr to finish a resist film having a thickness of about 1.0 micrometer. Then, the photoresist material solution prepared by dissolving ASiSt and the bis-azide compound was spun (at 3000 rpm) on the surface of the MP-1300 film and baked at 70° C. for 30 min to thereby form a uniform resist layer having a thickness of about 0.3 micrometers. Exposure was carried out using Kasper 2001P exposure apparatus equipped with a mask, and development was carried out by soaking the wafer in methylisobutylketone for 60 sec and then rinsing with isopropanol for 30 sec. By drying, the process of forming a resist pattern was completed. As to the sensitivity under purging with N$_2$, partial survival of the ASiSt film was observed when the exposure time was 0.5 sec or longer. However, an exposure time of about 10 sec was suitable for forming a good pattern.

To examine the adaptability of the patterned ASiSt film as a mask for dry etching of the underlying MP-1300 film, etching was carried out by O$_2$ milling (acceleration voltage 100–500 V, current density 0.25–0.9 mA/cm$^2$). After etching the resist pattern was observed with scanning electron microscope, and it was revealed that even after complete etching of the exposed areas of the MP-1300 film the resist pattern existed with thickness of 1500–2500 Å and that beneath the existing resist pattern the about 1 micrometer thick film of MP-1300 remained unetched with a nearly vertical profile.

EXAMPLE 8

A polymer having the structure represented by the formula shown below was prepared by the following process.

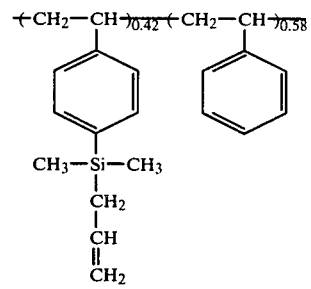

In a 100 ml three-neck flask, a mixture of 2.18 g of p-allyldimethylsilylstyrene, 1.04 g of styrene, 0.154 g of BPO and 10 ml of benzene was heated in a nitrogen atmosphere to undergo polymerization reaction for 7 hr at a reflux temperature. After that the reaction liquid was poured into a large volume of methanol to precipitate a polymer. After filtration the polymer was again dissolved in benzene, and the solution was poured into methanol to precipitate the refined polymer, which was recovered by filtration and dried at 50° C. under reduced pressure. The dried polymer weighed 2.28 g, so that the yield was 71%. $M_w$ of this polymer was 86000 and $M_n$ was 31000. Therefore, $M_w/M_n$ was 2.77.

Analysis of this polymer gave the following results.

Infrared Absorption Spectrum (cm$^{-1}$): 1630 (allyl group), 1240, 830 (Si—C).

Magnetic Resonance Spectrum (δ) ppm: 0.2–0.5 (br, CH$_3$), 0.8–3.3 (br, —CH$_2$—CH=CH, —CH$_2$—, —CH—φ), 4.2–5.3 (br, —CH=CH$_2$), 6.0–7.7 (br, benzene ring).

Elementary Analysis: C 83.62%, H 8.55%, Si 8.81%.

A photoresist material solution was prepared by dissolving the polymer prepared in this example and 2,6-di-(4'-azidebenzal)-4-methylcyclohexane amounting to 8 wt % of the polymer in xylene, followed by filtration with a 0.2 micrometers filter. In the same manner as in Example 7, MP-1300 and the photoresist of this example were sequentially applied to a silicon wafer, and exposure and development were carried out to form a resist pattern. In this case, however, the exposure time was extended to 20 sec and benzyl acetate was used as the developer.

Then the pattern was transferred into the underlying MP-1300 film by the etching method described in Example 7. It was confirmed that the resist pattern formed in this example fully served the purpose of the mask though the reduction in the thickness of the resist film was somewhat greater than in the case of Example 7.

What is claimed is:

1. A resist material comprising a polymer produced by polymerization of a monomer having an allylsilyl group, said monomer being a triallylsilane expressed by the formula R—Si(CH$_2$—CH=CH$_2$)$_3$, where R represents a hydrogen atom, methyl group, ethyl group, propyl group or phenyl group; and a photosensitive cross-linking agent which is a bis-azide compound and amounts to 0.1–50% by weight of said polymer.

2. A resist material according to claim 1, wherein said polymer comprises at least one structural unit selected from the group consisting of the structural units of the formulas (I) and (II), said polymer being produced by carrying out bulk or solvent polymerization of said triallylsilane at a temperature in the range from 60° to 150° C. for a period of 4 to 50 hr using a radical polymerization initiator amounting to 1–10 mole % of said triallylsilane:

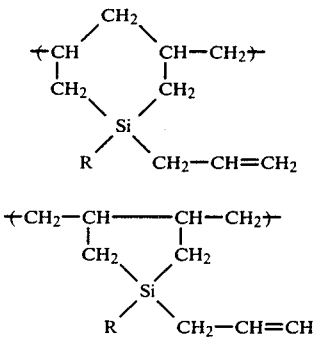

where R represents a hydrogen atom, methyl group, ethyl group, propyl group or phenyl group.

3. A resist material according to claim 2, wherein said polymer further comprises a structural unit expressed by the formula (III):

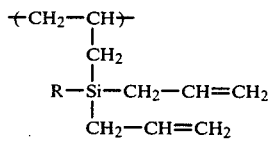

where R represents a hydrogen atom, methyl group, ethyl group, propyl group or phenyl group.

4. A resist material comprising a polymer produced by polymerization of a monomer having an allylsilyl group, said monomer being an allylsilylstyrene expressed by the general formula

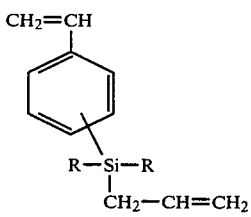

where R represents a hydrogen atom, methyl group, ethyl group, propyl group or allyl group.

5. A resist material according to claim 4, wherein said polymer is produced by carrying out bulk or solution polymerization of said allylsilylstyrene at a temperature in the range from 40° to 150° C. for a period of 2 to 30 hr using a radical polymerization initiator amounting to 0.01–5 mole % of said allylsilylstyrene and comprises a structural unit of the formula (IV):

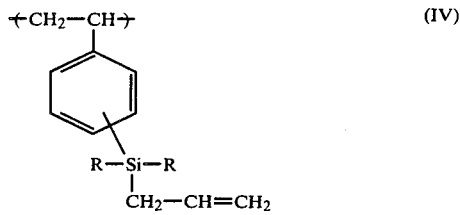

where R represents a hydrogen atom, methyl group, ethyl group, propyl group or allyl group.

6. A resist material according to claim 4, wherein said polymer is produced by carrying out bulk or solution copolymerization of said allylsilylstyrene and another ethylenic unsaturated monomer, which is copolymerizable with styrene and expressed by the general formula $CH_2=CH-A$, at a temperature in the range from 40° to 150° C. for a period of 2 to 30 hr using a radical polymerization initiator amounting to 0.01–5 mole % of the total of said allylsilylstyrene and said ethylenic unsaturated monomer and has a structure expressed by the formula (V):

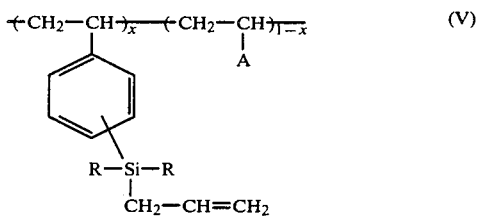

where R represents a hydrogen atom, methyl group, ethyl group, propyl group or allyl group, and x is smaller than 1 but is not smaller than 0.2.

7. A resist material according to claim 6, wherein said other monomer is selected from the group consisting of acrylic acid, methyl-, ethyl-, glycidyl-, vinyl- and allyl esters of acrylic acid, methacrylic acid, methyl-, ethyl-, glycidyl-, vinyl- and allyl esters of methacrylic acid, styrene, chlorostyrene, methylstyrene and choloromethylstyrene.

8. A resist material according to claims 2, 5, or 6, wherein said polymer has a weight average molecular weight in the range from 10000 to 1000000 and is not larger than 3 in the degree of polydispersity.

9. A resist material according to claims 5 or 6, further comprising a photosensitive cross-linking agent which is a bis-azide compound and amounts to 0.1–50% by weight of said polymer.

10. A resist material according to claim 9, wherein said bis-azide compound is selected from the group consisting of 4,4-diazidechalcone, 2,6-di-(4'-azidebenzylidene)-cyclohexanone, 2,6-di-(4'-azidebenzylidene)-4-methylcyclohexanone and 2,6-di-(4'-azidebenzylidene)-4-hydroxycyclohexanone.

11. A resist material according to claim 1, wherein said bis-azide compound is selected from the group consisting of 4,4-diazidechalcone, 2,6-di-(4'-azidebenzylidene)-cyclohexanone, 2,6-di-(4'-azidebenzylidene)-4-methylcyclohexanone and 2,6-di-(4'-azidebenzylidene)-4-hydroxycyclohexanone.

* * * * *